United States Patent [19]

Lee

[11] 4,292,647
[45] Sep. 29, 1981

[54] SEMICONDUCTOR PACKAGE AND ELECTRONIC ARRAY HAVING IMPROVED HEAT DISSIPATION

[75] Inventor: James C. K. Lee, Los Altos Hills, Calif.

[73] Assignee: Amdahl Corporation, Santa Clara, Calif.

[21] Appl. No.: 27,769

[22] Filed: Apr. 6, 1979

[51] Int. Cl.³ .............. H01L 39/02; H01L 23/02; H01L 23/12
[52] U.S. Cl. ................................ 357/81; 357/80; 357/74; 165/80 B
[58] Field of Search ............... 357/81, 82, 74, 80; 165/80, 105

[56] References Cited

U.S. PATENT DOCUMENTS

| | | | |
|---|---|---|---|
| 3,365,620 | 1/1968 | Butler et al. | 357/82 |
| 3,406,753 | 10/1968 | Habdas | 357/81 |
| 3,590,915 | 7/1971 | Riedel | 357/81 |
| 4,069,498 | 1/1978 | Joshi | 357/81 |
| 4,092,697 | 5/1978 | Spaight | 357/81 |

OTHER PUBLICATIONS

Chip Heat Sink Package; Johnson IBM Technical Bulletin vol. 12, No. 10, Mar. 1970, p. 1665.
Cooling Cap for Powder or Liquid Filled Module; Antipps; IBM Technical Bulletin, vol. 18, No. 5, Oct. 1975, pp. 1387 & 1388.
Centerless Ceramic Package with Directly Connected Heat Sink, IBM Bulletin; Ronkese, vol. 20, No. 19, Feb. 1978.
Semiconductor Package with Improved Cooling, IBM Tech. Bulletin, vol. 20, No. 9, Feb. 1978 pp. 3452 & 3453.

*Primary Examiner*—Andrew J. James
*Attorney, Agent, or Firm*—David E. Lovejoy

[57] ABSTRACT

A semiconductor package and electronic array in which the semiconductor packages of the array share a common substrate. The substrate has a plurality of sets of contacts with each set of contacts receiving contacts of a semiconductor chip. Each chip and set of contacts is surrounded by a closed length of bond receptive material. A heat dissipation member is attached to each chip by means of a heat conductive plate, and an annular ring is bonded to each heat dissipation member and to the closed length of bond receptive material to hermetically seal the chip.

20 Claims, 5 Drawing Figures

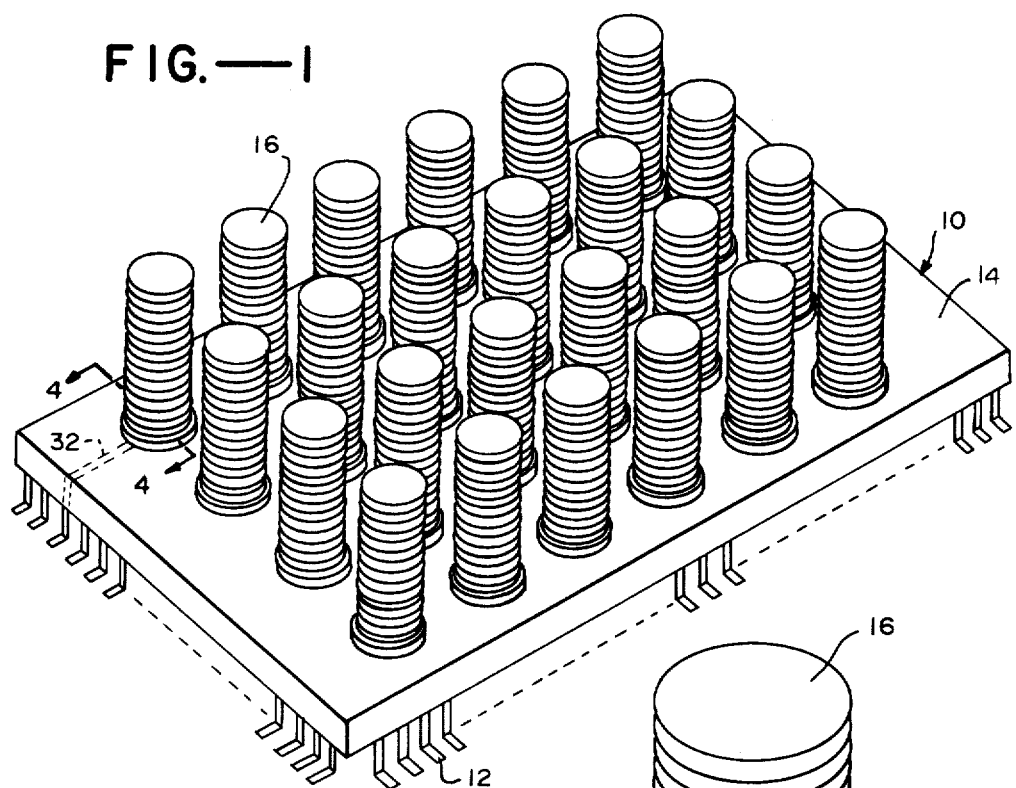
FIG.—1
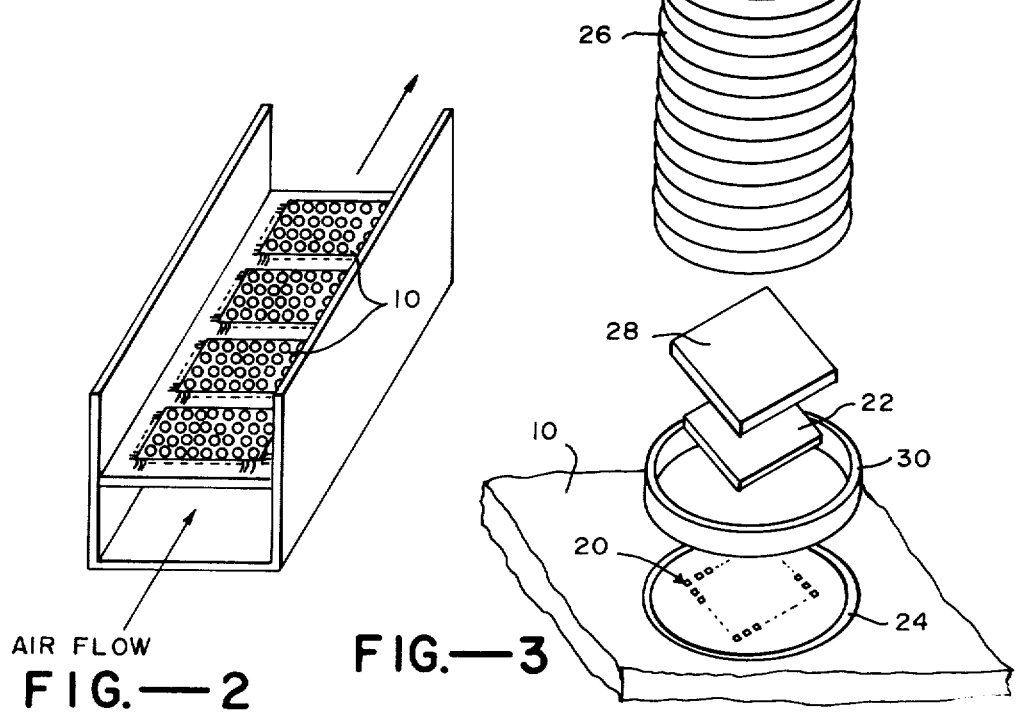
FIG.—2
FIG.—3

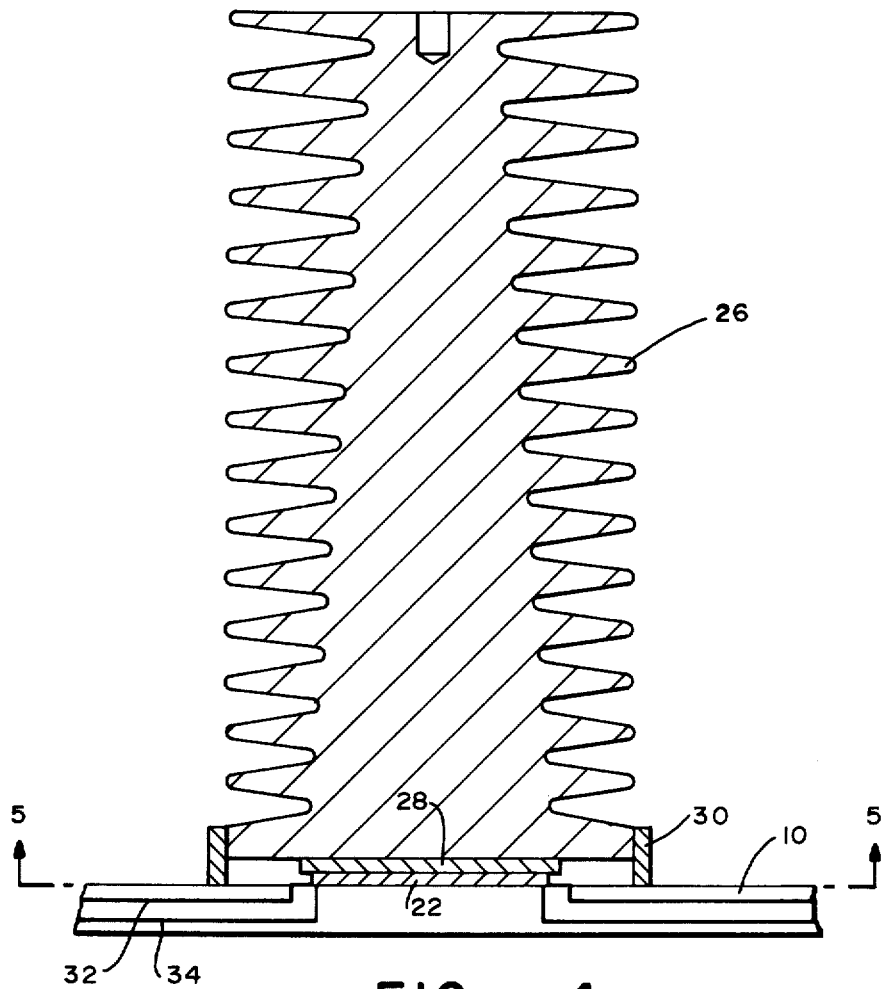
FIG.—4
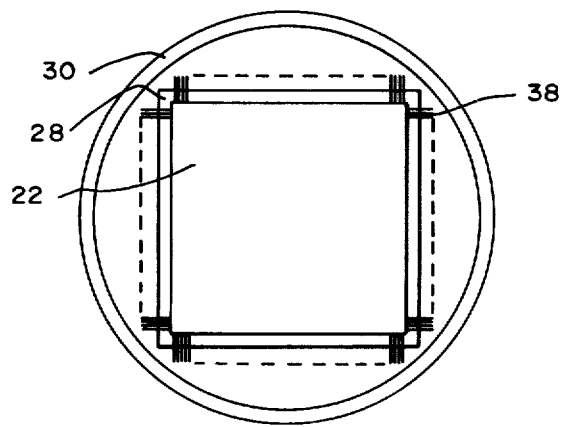
FIG.—5

SEMICONDUCTOR PACKAGE AND ELECTRONIC ARRAY HAVING IMPROVED HEAT DISSIPATION

This invention relates generally to electronic circuits and packages therefor, and more particularly the invention relates to electronic arrays including integrated semiconductor circuits requiring high heat dissipation.

Modern electronic circuits are typically embodied in semiconductor integrated circuits. While components of these circuits are microscopic in size, the density of Large Scale Integrated (LSI) circuits and Very Large Scale Integrated (VLSI) creates a heat dissipation problem in arrays of such circuits such as found in computer systems.

Large scale general purpose computer systems employing digital logic semiconductor chips with increased circuit density offer improved performance at reduced cost and size. A design constraint lies in dissipating the large amount of heat generated by semiconductor circuits. While water cooling has been utilized, air cooling is preferred if sufficient heat removal can be effected.

U.S. Pat. Nos. 3,808,475 and 3,872,583 disclose a commercially available circuit construction and air-cooled package. Each chip is individually packaged with each chip bonded to a ceramic mount. A plurality of leads extend from the ceramic mount for interconnecting the chip with other circuit chips.

While these air-cooled packages have performed well, as circuit densities continue to increase, packages offering improved heat dissipation are required to accommodate the power of and the attendant heat generated by the semiconductor chip.

An object of the present invention is an improved hermetically sealed semiconductor package.

Another object of the invention is an array of semiconductor packages having improved heat dissipation.

Still another object of the invention is a semiconductor package and circuit array which is economical to manufacture.

Yet another object of the invention is a semiconductor package and array which lends itself to mass production.

Another object of the invention is an electronic array which provides greater circuit density and increased operating speeds.

Yet another object of the invention is an electronic array which is economical to manufacture.

Another object of the invention is an electronic array having increased circuit density and which is efficiently air-cooled.

Briefly, a semiconductor package in accordance with the invention includes a mounting substrate, a semiconductor chip with one surface thereof mounted directly to and electrically connected with said substrate, heat dissipation means, and means for attaching the heat dissipation means to the opposite surface of the semiconductor chip. Sealing means is attached to the heat dissipation means and to the substrate to hermetically seal the semiconductor chip. In a preferred embodiment the means for attaching the heat dissipation means to the chip comprises a heat conductive plate.

Advantageously, the substrate preferably includes a conductive lead pattern which interconnects a plurality of semiconductor chips mounted directly to the substrate, thereby providing an electronic array having increased circuit density.

The package and array in accordance with the invention provides increased heat dissipation and is economical to manufacture. Advantageously, integrated circuit chips which have been pretested while mounted on a film carrier and the like can be mounted to the substrate with the heat conductive plate attached thereto, and the chip can then be inspected and again tested prior to the final hermetic sealing of the chip. Further, the use of the substrate and the heat dissipation means as integral parts of the encapsulating package for the chip reduces costs substantially.

These and other objects and features of the invention will be more readily apparent from the following detailed description and appended claims when taken with the drawing.

In the drawings,

FIG. 1 is a perspective view of one embodiment of an electronic array in accordance with the present invention.

FIG. 2 is a perspective view of a plurality of electronic arrays in a larger air-cooled assembly in accordance with the invention.

FIG. 3 is an exploded perspective view of one embodiment in accordance with the present invention of a semiconductor package in the array of FIG. 1.

FIG. 4 is a section view of the assembled semiconductor package taken along line 3—3 in FIG. 1.

FIG. 5 is a section view taken along line 5—5 of FIG. 4.

Referring now to the drawing, FIG. 1 is a perspective view of one embodiment of an electronic array in accordance with the invention. The array includes a substrate 10 having a plurality of contacts 12 about the periphery thereof and extending therefrom and including a plurality of semiconductor chips mounted on a major surface 14 thereof. As will be described further hereinbelow, each chip is attached to a heat dissipation means such as heat sinks 16 for the dissipation of heat by air cooling. Preferably substrate 10 comprises a fused ceramic structure including multi-layer circuit patterns therein which electrically interconnect the semiconductor chips mounted on surface 14 and the contacts 12 about the periphery of substrate 10. The electronic array of FIG. 1 may be connected in a larger air-cooled assembly of a computer system, for example, as shown in FIG. 2.

FIG. 3 is an exploded perspective view of one embodiment of each semiconductor package as mounted on substrate 10 of FIG. 1. As shown therein, substrate 10 includes a contact pattern 20 which mates with contacts or leads extending from semiconductor chip 22 to thereby interconnect chip 22 with other chips mounted on the surface of substrate 10 and with the contacts 12. A seal ring 24 surrounds the contact pattern 20 and facilitates the hermetic sealing of chip 22 in the completed package. To accommodate solder bonding, the seal ring 24 preferably comprises a thin layer of gold deposited on a layer of chrome on the ceramic substrate.

Chip 22 is attached to a heat dissipation means such as a copper heat sink 26 directly by solder or epoxy adhesive or by means such as a heat conductive plate 28. In one embodiment the plate 28 comprises beryllia with the major surfaces of the beryllia plate being metallized to accept tin-silver solder. The heat sink 26 may be solid copper with a plurality of fins to increase heat removal. In manufacturing the semiconductor package, the bottom surface of plate 28 is soldered to the top surface of chip 22, and the top surface of plate 28 is soldered to the bottom surface of the copper heat sink 26. The package is completed and the semiconductor chip 22 hermetically sealed by means of a seal ring 30 which is configured to mate with the bottom of heat sink 26 and with seal ring 24. Advantageously, use of the seal ring eliminates critical dimensions in aligning the stacked array with adjacent components abutting. The seal ring may comprise copper which accepts solder or a ceramic such as aluminum oxide which has been metallized with nickel-gold to accomodate solder. Alternatively, the seal ring may be attached to the heat sink 26 by suitable epoxy adhesive sealant.

FIG. 4 is a side view, taken along line 4—4 in FIG. 1, of the assembled semiconductor package with the semiconductor chip 22 attached to the mating contacts on the surface of substrate 10. Thermally conductive plate 28 is attached to the top surface of chip 22 and to the bottom surface of heat sink 26. Seal ring 30 is attached to heat sink 26 either by solder or by epoxy adhesive and to substrate 10 by solder or other suitable means. The mating contacts on the surface of substrate 10 interconnect chip 22 through a multilayer lead pattern shown at 32 and 34 to other chips mounted on the surface of substrate 10.

FIG. 5 is a section view taken along line 5—5 of FIG. 3 and further illustrates the relative position of semiconductor chip 22, the overlying heat conductive plate 28, and seal ring 30. Plate 28 preferably overlaps all edges of chip 22 to insure maximum heat transmission from chip 22 to heat sink 26. Beam lead contacts 38 extend from the periphery of chip 22 for interconnection with the mating contacts 20 on substrate 10. The contacts are bonded to the mating contacts by conventional thermocompression bonding. While beam lead contacts are preferred, it will be appreciated that other suitable contacts such as ball contacts can be provided on the surface of semiconductor chip 22 for attachment to the mating contact pattern on the substrate by solder or other suitable means.

In manufacturing the electronic array, the semiconductor chips with the heat conductive plates attached thereto may be pretested while attached to a film carrier or other suitable chip carrier. Advantageously, after assembly of the chip to the substrate and the attachment of the heat sink to the heat transmission plate, the assembly can be inspected and further electrical tests conducted prior to attachment of seal ring 30 and the hermetic sealing of the semiconductor chip. This facilitates the correction of poor electrical contacts and bonds and allows the replacement of defective chips.

By utilizing the heat sink and the substrate as part of the semiconductor chip package, assembly is simplified and manufacturing costs are reduced. Moreover, by providing the entire surface of the chip in direct thermal conduction to the heat sink, improved heat dissipation is facilitated. Nearly a fivefold increase in thermal conduction is realized when compared to conventional air-cooled packages. Accordingly, larger chips can be accommodated in each package for a desired operating temperature.

While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

What is claimed is:

1. An electronic array comprising a substrate having a conductive lead pattern and a plurality of sets of contacts on a major surface, each set of contacts being configured to receive contacts of a semiconductor chip, a closed length of bond receptive material surrounding each set of contacts, a plurality of semiconductor chips, each of said chips having a plurality of contacts on one surface with said plurality of contacts attached to one of said sets of contacts on said major surface, a plurality of heat dissipation members each with a contact surface having an area greater than the area of a corresponding one of said chips and each having an outer wall formed at the termination of said contact surface, means attaching each chip to a central region of the contact surface of a heat dissipation member, and means bonded to the outer wall of each of said heat dissipation members and to one of said closed length of bond receptive material for enclosing each of said chips.

2. An electronic array as defined by claim 1 wherein said means attaching each chip comprises a heat conductive plate.

3. An electronic array as defined by claim 2 wherein said means for enclosing each of said chips comprises an annular ring.

4. An electronic array as defined by claim 3 wherein each of said annular rings is soldered to said heat dissipation members and to said closed length of bond receptive material.

5. An electronic array as defined by claim 4 wherein said closed length of bond receptive material comprises chrome-gold, each of said annular rings comprises copper, and said heat dissipation member comprises copper.

6. An electronic array as defined by claim 3 wherein each of said annular rings is adhesively bonded to said heat dissipation member and soldered to said closed length of bond receptive material.

7. An electronic array as defined by claim 2 wherein each of said plates comprises a ceramic with a layer of solderable material on each major surface of each of said plates.

8. An electronic array as defined by claim 7 wherein said ceramic comprises beryllia and said solderable material comprises nickel-gold.

9. An electronic array as defined by claim 1 wherein said plurality of contacts on each of said chips comprises beam leads.

10. An electronic array as defined by claim 1 wherein said substrate comprises a ceramic with said conductive lead pattern comprising a multiple layer of conductive material.

11. An electronic array as defined by claim 10 wherein said substrate further includes a plurality of electrical contacts whereby said substrate can be electrically interconnected with other circuitry.

12. A hermetically sealed semiconductor package comprising a substrate having a major surface, a plurality of contacts on said substrate, a semiconductor chip, a plurality of electrical contacts on said chip, means attaching said plurality of electrical contacts on said chip to said plurality of contacts on said substrate, heat dissipation means with a contact surface having an area greater than the area of a chip and with an outer wall surrounding said contact surface, means attaching said chip to a central region of said heat dissipation means, and sealing means attached to the outer wall of said heat dissipation means and to said substrate and hermetically sealing said semiconductor chip.

13. A hermetically sealed semiconductor package as defined by claim 12 wherein said means attaching said heat dissipation means to said chip comprises a heat conductive plate.

14. A hermetically sealed semiconductor package as defined by claim 13 wherein said sealing means comprises an annular ring.

15. A hermetically sealed semiconductor package as defined by claim 14 wherein said annular ring is soldered to said heat dissipation means and to said substrate.

16. A hermetically sealed semiconductor package as defined by claim 13 wherein said means attaching said plate to said chip and to said heat dissipation comprises solder.

17. A hermetically sealed semiconductor package as defined by claim 16 wherein said means attaching said plurality of electrical contacts on said chip to said plurality of contacts on said substrate comprises thermo compression bonds.

18. A hermetically sealed semiconductor package as defined by claim 17 wherein said sealing means comprises an annular ring and wherein said annular ring is soldered to said heat dissipation means and to said substrate.

19. A hermetically sealed semiconductor package as defined by claim 12 wherein said substrate includes a conductive lead pattern electrically interconnecting said semiconductor chip to a plurality of other semiconductor chips on said substrate.

20. An electronic array comprising a substrate having a conductive lead pattern and a plurality of sets of contacts on a major surface, each set of contacts being configured to receive contacts of a semiconductor chip, a closed length of bond receptive material surrounding each set of contacts, a plurality of semiconductor chips, each of said chips having a plurality of contacts on a first surface with said plurality of contacts attached to one of said sets of contacts on said major surface, each of said chips having a second surface substantially parallel to said first surface for transfer of heat from said chips, each of said chips having a thickness measured between said first and second surfaces, a plurality of heat dissipation members each with a contact surface having an area greater than the area of a corresponding second surface of said chips and each having an outer wall terminating said contact surface, said outer wall extending at an angle to said contact surface, means attaching said second surface of each chip to a central region of the contact surface of a corresponding heat dissipation member whereby a gap is provided between an outer region of the contact surface and said major surface where the gap dimension includes the thickness of the chip, and means bonded to the outer wall of each of said heat dissipation members and to one of said closed length of bond receptive material for enclosing said gap and each of said chips irrespective of the dimensions of the gaps and the thickness of said chips.

* * * * *